United States Patent
Nummy et al.

(10) Patent No.: US 8,507,915 B2
(45) Date of Patent: Aug. 13, 2013

(54) LOW RESISTANCE EMBEDDED STRAP FOR A TRENCH CAPACITOR

(75) Inventors: Karen A. Nummy, Newburgh, NY (US); Chengwen Pei, Danbury, CT (US); Werner A. Rausch, Stormville, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/307,787

(22) Filed: Nov. 30, 2011

(65) Prior Publication Data

US 2013/0134490 A1    May 30, 2013

(51) Int. Cl.
*H01L 29/94* (2006.01)

(52) U.S. Cl.
USPC .......................................... 257/68; 438/243

(58) Field of Classification Search
USPC ............... 257/68, 71, E27.084, 905, 906, 908
See application file for complete search history.

(56) References Cited

U.S. PATENT DOCUMENTS

| | | | |
|---|---|---|---|
| 5,969,378 A | 10/1999 | Singh | |
| 5,981,933 A | 11/1999 | Chamberlain et al. | |
| 6,037,620 A | 3/2000 | Hoenigschmid et al. | |
| 6,326,658 B1 | 12/2001 | Tsunashima et al. | |
| 6,552,378 B1 | 4/2003 | Hoenigschmid et al. | |
| 6,815,749 B1 | 11/2004 | Mandelman et al. | |
| 7,091,546 B2 * | 8/2006 | Sato et al. | 257/301 |
| 7,316,952 B2 | 1/2008 | Lee | |
| 7,405,131 B2 | 7/2008 | Chong et al. | |
| 7,888,723 B2 | 2/2011 | Brodsky et al. | |
| 2004/0175897 A1 | 9/2004 | Wensley et al. | |
| 2005/0017282 A1 | 1/2005 | Dobuzinsky et al. | |
| 2005/0082616 A1 * | 4/2005 | Chen et al. | 257/350 |
| 2006/0102947 A1 | 5/2006 | Wu | |
| 2006/0148151 A1 | 7/2006 | Murthy et al. | |
| 2010/0258904 A1 | 10/2010 | Li et al. | |
| 2011/0272762 A1 * | 11/2011 | Booth et al. | 257/347 |

OTHER PUBLICATIONS

Application No. GB1221413.6 United Kingdom combined Search and Examination Report dated Mar. 22, 2013.

* cited by examiner

*Primary Examiner* — Matthew Reames
*Assistant Examiner* — Nicholas J Choi
(74) *Attorney, Agent, or Firm* — Scully, Scott, Murphy & Presser, P.C.; Joseph P. Abate, Esq.

(57) ABSTRACT

A trench is formed in a semiconductor substrate, and is filled with a node dielectric layer and at least one conductive material fill portion that functions as an inner electrode. The at least one conductive material fill portion includes a doped polycrystalline semiconductor fill portion. A gate stack for an access transistor is formed on the semiconductor substrate, and a gate spacer is formed around the gate stack. A source/drain trench is formed between an outer sidewall of the gate spacer and a sidewall of the doped polycrystalline semiconductor fill portion. An epitaxial source region and a polycrystalline semiconductor material portion are simultaneously formed by a selective epitaxy process such that the epitaxial source region and the polycrystalline semiconductor material portion contact each other without a gap therebetween. The polycrystalline semiconductor material portion provides a robust low resistance conductive path between the source region and the inner electrode.

11 Claims, 18 Drawing Sheets

LOW RESISTANCE EMBEDDED STRAP FOR A TRENCH CAPACITOR

BACKGROUND

The present disclosure relates to a semiconductor device, and particularly to a semiconductor device including a trench capacitor, an access transistor, and an embedded strap providing a conductive path between an electrode of the trench capacitor and a source region of the access transistor, and methods of manufacturing the same.

Trench capacitors are employed for various applications including stand-alone dynamic random access memory (DRAM) devices, embedded DRAM devices, and decoupling capacitors. Some applications of the trench capacitors require a low resistance electrically conductive path to an electrode of a trench capacitor. For example, high performance embedded eDRAM devices require a conductive path between an inner electrode of a trench capacitor and a source region of an access transistor.

A silicide strap formed between an inner electrode of a trench capacitor and a source region of an access transistor can have yield problems due to the proximity of a trench top oxide (TTO), which can cause formation of divots at an interface between the inner electrode of the trench capacitor and the source region. The divots can be filled by a non-conductive foreign material, or may remain unfilled after formation of a silicide buried strap. In such cases, the electrical connection between the inner electrode of the trench capacitor and the source region can be a source of a yield problem or a reliability problem. Thus, a more robust and manufacturable structure for an electrically conductive path between an inner electrode of a trench capacitor and a source region of an access transistor is desired.

BRIEF SUMMARY

A trench is formed in a semiconductor substrate, and is filled with a node dielectric layer and at least one conductive material fill portion that functions as an inner electrode. The at least one conductive material fill portion includes a doped polycrystalline semiconductor fill portion. A gate stack for an access transistor is formed on the semiconductor substrate, and a gate spacer is formed around the gate stack. A source/drain trench is formed between an outer sidewall of the gate spacer and a sidewall of the doped polycrystalline semiconductor fill portion. An epitaxial source region and a polycrystalline semiconductor material portion are simultaneously formed by a selective epitaxy process such that the epitaxial source region and the polycrystalline semiconductor material portion contact each other without a gap therebetween. The polycrystalline semiconductor material portion provides a robust low resistance conductive path between the source region and the inner electrode. The material of the epitaxial source region and the polycrystalline semiconductor material portion provide a lateral stress to a channel of the access transistor.

According to an aspect of the present disclosure, a semiconductor structure includes a trench, a source region, and a polycrystalline semiconductor material portion. The trench is located in a semiconductor substrate, extends in a semiconductor layer that includes a single crystalline semiconductor material, and is filled with a node dielectric layer and at least one conductive fill material portion. The at least one conductive material portion includes a doped semiconductor fill portion laterally contacting the single crystalline semiconductor material. The source region is embedded within the semiconductor layer and includes another single crystalline semiconductor material, which is different from the single crystalline semiconductor material and is epitaxially aligned to the single crystalline semiconductor material. The polycrystalline semiconductor material portion contacts a topmost horizontal surface of the doped semiconductor fill portion and includes a same material as the source region and contacting the source region.

According to another aspect of the present disclosure, a method of forming a semiconductor structure is provided. The method includes: forming a trench in a semiconductor substrate, wherein the trench extends in a semiconductor layer including a single crystalline semiconductor material; filling the trench with a node dielectric layer and at least one conductive fill material portion that includes a semiconductor fill portion; and forming a source/drain trench in the semiconductor layer. A top surface of the semiconductor fill portion is physically exposed, and the source/drain trench is laterally bounded by a sidewall surface of the semiconductor fill portion. The method further includes: depositing an epitaxial semiconductor material portion directly on single crystalline surfaces of the source/drain trench and a polycrystalline semiconductor material portion on the semiconductor fill portion.

DETAILED DESCRIPTION

Figure 1:
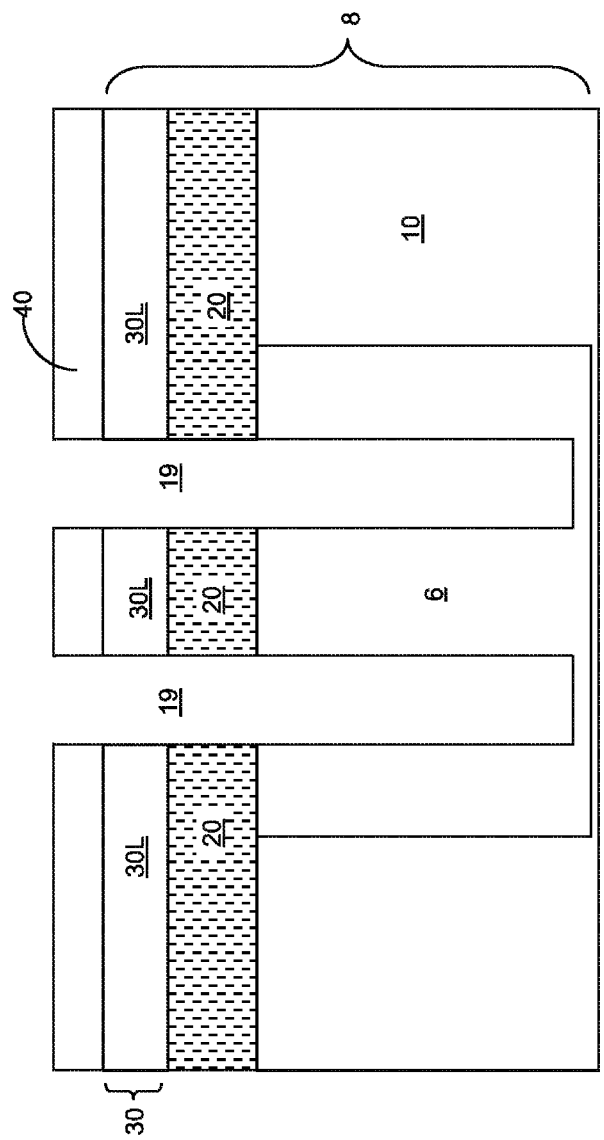
FIG. 1 is a vertical cross-sectional view of a first exemplary semiconductor structure after formation of deep trenches and a buried plate in a semiconductor substrate according to a first embodiment of the present disclosure.

As stated above, the present disclosure relates to a semiconductor device including a trench capacitor, an access transistor, and an embedded strap providing a conductive path between an electrode of the trench capacitor and a source region of the access transistor, and methods of manufacturing the same, which are now described in detail with accompanying figures. It is noted that like and corresponding elements mentioned herein and illustrated in the drawings are referred to by like reference numerals.

A "deep trench" herein refers to a trench that extends at least from a top surface of a top semiconductor layer of a semiconductor-on-insulator (SOI) substrate and at least to a bottom surface of a buried insulator layer in the SOI substrate, or to a trench that has a depth greater than 2 microns and is formed in a bulk semiconductor substrate.

Referring to FIG. 1, a first exemplary semiconductor structure according to a first embodiment of the present disclosure includes a semiconductor substrate 8. The semiconductor substrate 8 can be a semiconductor-on-insulator (SOI) substrate that includes, from bottom to top, a stack of a handle substrate layer 10, a buried insulator layer 20, and a top semiconductor layer 30 that includes a semiconductor material. The handle substrate layer 10 is a semiconductor substrate including a semiconductor material. For example, the handle substrate layer 10 can be a single crystalline silicon substrate. The thickness of the handle substrate layer 10 is sufficient to provide mechanical support to other layers, i.e., the buried insulator layer 20 and the top semiconductor layer 30. For example, the thickness of the handle substrate layer 10 can be from 50 microns to 1 mm, although lesser and greater thicknesses can also be employed. In a non-limiting illustrative example, the handle substrate layer 10 can include single crystalline silicon having a p-type doping at a dopant concentration from $1.0 \times 10^{14}/cm^3$ to $1.0 \times 10^{18}/cm^3$, although lesser and greater dopant concentrations and/or n-type doping can also be employed.

The buried insulator layer 20 includes a dielectric material such as silicon oxide and/or silicon nitride. In one embodiment, the buried insulator layer 20 can include thermal silicon oxide. The thickness of the buried insulator layer 20 can be from 20 nm to 5 microns, and typically from 100 nm to 1 micron. The buried insulator layer 20 provides electrical isolation of components above the buried insulator layer 20 from the handle substrate layer 10. If the handle substrate layer 10 is an insulator substrate, the buried insulator layer 20 can be removed without affecting electrical isolation of devices in and above the doped polycrystalline semiconductor layer 14. The buried insulator layer 20 can be formed on the handle substrate layer 10 by deposition of a dielectric material, conversion of a surface portion of the handle substrate layer 10, or by bonding and/or cleaving.

The top semiconductor layer 30 includes a semiconductor material such as silicon, germanium, a silicon-germanium alloy, a silicon-carbon alloy, a silicon-germanium-carbon alloy, a III-V compound semiconductor material, a II-VI compound semiconductor material, an organic semiconductor material, or a combination or a stack thereof. The thickness of the top semiconductor layer 30 can be from 10 nm to 300 nm, and typically from 20 nm to 150 nm, although lesser and greater thicknesses can also be employed.

In one embodiment, the top semiconductor 30 can include a single crystalline semiconductor layer 30L, which includes a first single crystalline semiconductor material having a first lattice constant throughout the entirety thereof. All or portions of the single crystalline semiconductor layer 30L can be doped with dopants of various concentrations and/or conductivity types (p-type and n-type). In a non-limiting illustrative example, the single crystalline semiconductor layer 30L can include at least one p-doped single crystalline silicon portion having a p-type doping at a dopant concentration from $1.0 \times 10^{14}/cm^3$ to $1.0 \times 10^{18}/cm^3$, although lesser and greater dopant concentrations and/or n-type doping can also be employed.

A bulk semiconductor substrate can be employed instead of an SOI substrate for the semiconductor substrate 8. In this case, the bulk substrate can include a first single crystalline semiconductor material throughout. The first single crystalline semiconductor material can have a first lattice constant throughout the entirety of the bulk semiconductor substrate. All or portions of the bulk semiconductor substrate can be doped with dopants of various concentrations and/or conductivity types (p-type and n-type). In a non-limiting illustrative example, the bulk semiconductor substrate can include at least one p-doped single crystalline silicon portion having a p-type doping at a dopant concentration from $1.0 \times 10^{14}/cm^3$ to $1.0 \times 10^{18}/cm^3$, although lesser and greater dopant concentrations and/or n-type doping can also be employed. While embodiments employing an SOI substrate are described in the present disclosure, the method of structure of the described embodiments can also be implemented in embodiments employing a bulk semiconductor substrate with necessary modifications.

At least one pad layer 40 and a hardmask layer (not shown) are sequentially deposited on the top semiconductor layer 30. The at least one pad layer 40 can be formed directly on the top semiconductor layer 30, for example, by a blanket deposition employing chemical vapor deposition (CVD). Typically, the at least one pad layer 40 comprises a dielectric material such as a dielectric nitride or a dielectric oxide. The at least one pad layer 40 can include a stack of multiple dielectric layers. For example, the at least one pad layer can be a stack of a thin silicon oxide layer formed directly on the top semiconductor layer 30 and a thicker silicon nitride layer formed on the thin silicon oxide layer. The thickness of the at least one pad layer 40 can be from 80 nm to 1,000 nm, and preferably from 120 nm to 250 nm. The pad layer 40 can be formed directly on the top semiconductor layer 30 by chemical vapor deposition (CVD).

The hardmask layer can be deposited to be subsequently employed as an etch mask for forming deep trenches. The hardmask layer typically comprises a dielectric material such as borosilicate glass (BSG) or undoped silicate glass (USG). The thickness of the hardmask layer can be from 100 nm to 1 micron, although lesser and greater thicknesses can also be employed.

A photoresist (not shown) is formed on the top surface of the hardmask layer and lithographically patterned to form openings in the photoresist. The openings in the photoresist can be formed over areas of the semiconductor substrate 8 in which deep trenches 19 are subsequently formed. The pattern in the photoresist is transferred into the hardmask layer by a first anisotropic etch, which is referred to as a mask open etch. After the pattern in the photoresist is duplicated in the hardmask layer, the photoresist can be removed, for example, by ashing. Employing the hardmask layer as an etch mask, the pattern in the hardmask layer is transferred through the at least one pad layer 40, the top semiconductor layer 30, the buried insulator layer 20, and an upper portion of the handle substrate layer 10 by another anisotropic etch, which is referred to as a deep trench etch. The hardmask layer is subsequently removed selective to the materials in the semiconductor substrate 8 and the at least one pad layer 40. The depth of the deep trenches, as measured from the top surface of the top semiconductor layer 30 to the bottommost surface of the deep trenches 19 can be from 2 microns to 10 microns, although lesser depth can be employed if the semiconductor substrate 8 is an SOI substrate.

A buried plate 6 can be formed by converting a portion of the handle substrate layer 10 that is proximal to sidewalls and bottom surfaces of the deep trenches into a doped semiconductor portion having a doping of the opposite conductivity type than the conductivity type of the handle substrate layer 10 as originally provided. Dopants can be introduced into the buried plate 6 by outdiffusion of a disposable dopant source layer (such as an arsenosilicate glass (ASG) layer) that is conformally deposited, annealed, and subsequently removed, angled ion implantation, gas phase doping, and/or plasma doping. For example, the handle substrate layer 10 can include single crystalline silicon having a p-type doping at a dopant concentration from $1.0 \times 10^{19}/cm^3$ to $1.0 \times 10^{21}/cm^3$.

Figure 2:
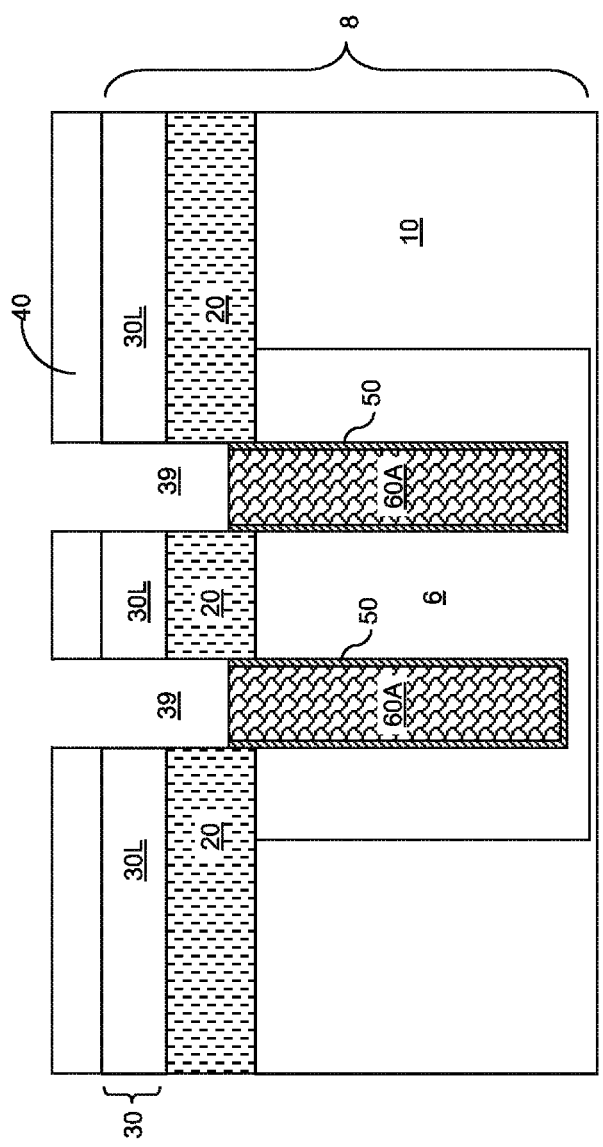
FIG. 2 is a vertical cross-sectional view of the first exemplary semiconductor structure after formation of node dielectric layers and lower inner electrodes according to the first embodiment of the present disclosure.

Referring to FIG. 2, a node dielectric layer 50 and a lower conductive fill material portion 60A are formed within each deep trench 19. Specifically, a contiguous node dielectric layer (not shown) is formed directly on sidewalls and a bottom surface of each deep trench 19 and the top surface of the at least one pad layer 40. At least one conductive fill material is deposited within, and fills, the deep trenches 19. Excess portions of the contiguous node dielectric layer and the at least one conductive fill material above the top surface of the at least one pad layer 40 are removed by planarization, which can be effected, for example, by a recess etch, chemical mechanical planarization (CMP), or a combination thereof.

The at least one conductive fill material is recessed to a depth, which is between the bottom surface and the top surface of the buried insulator layer 20. A recessed region 39 is formed within an upper portion of each deep trench 19. The exposed portions of the remaining portions of the contiguous node dielectric layer, which are confined within each trench 39 and are separated from one another, are removed, for example, by a wet etch. The remaining portions of the contiguous node dielectric layer after the wet etch constitute the node dielectric layers 50. The remaining portions of the at least one conductive fill material constitute the lower conductive fill material portions 60A. The lower conductive fill material portions 60A can include a doped semiconductor material such as doped polysilicon and/or at least one metallic material.

If a bulk semiconductor substrate is employed for the semiconductor substrate 8, a dielectric collar (not shown) extending from the depth of the topmost surface of the lower conductive fill material portions 60A to the top surface of the bulk substrate can be formed, for example, by oxidation or by deposition of a conformal dielectric layer and an anisotropic etch.

Figure 3:
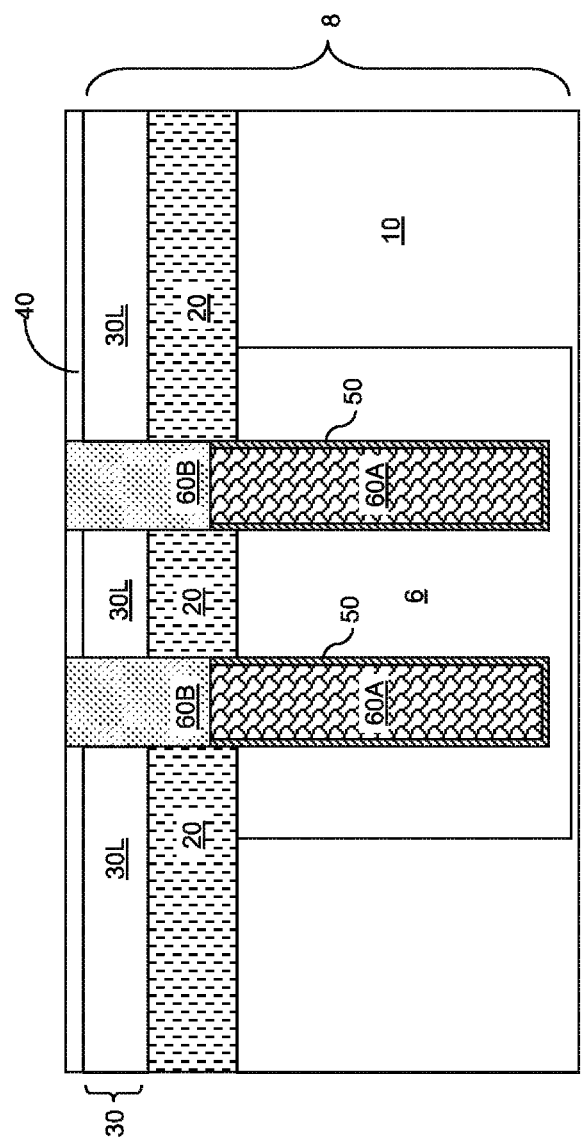
FIG. 3 is a vertical cross-sectional view of the first exemplary semiconductor structure after formation of semiconductor fill portions according to the first embodiment of the present disclosure.

Referring to FIG. 3, a semiconductor material is deposited to fill the recessed regions 39. The excess semiconductor material deposited above the top surface of the at least one pad layer 40 is removed by planarization, which can be performed by chemical mechanical planarization (CMP), a recess etch, or a combination thereof. The cumulative planarization processes can reduce the thickness of the at least one pad layer 40.

Each remaining portion of the semiconductor material within the recessed regions 39 constitutes an upper conductive fill material portion 60B. Thus, the upper conductive fill material portion 60B is a semiconductor fill portion. The upper conductive fill material portion 60B laterally contacts the single crystalline semiconductor layer 30L.

The semiconductor material of the upper conductive fill material portions 60B can be amorphous or polycrystalline as deposited. Further, the semiconductor material of the upper conductive fill material portions 60 can be deposited as a doped semiconductor material or an undoped semiconductor material that is doped in a subsequent processing step.

Figure 4:
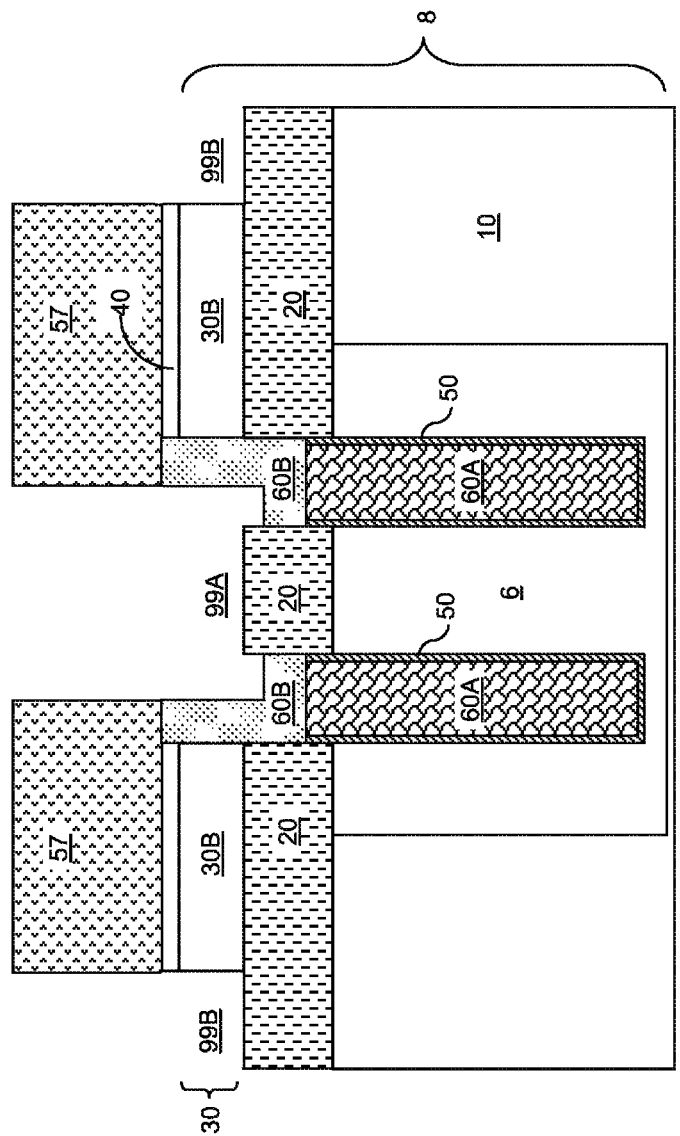
FIG. 4 is a vertical cross-sectional view of the first exemplary semiconductor structure after formation of various shallow trenches according to the first embodiment of the present disclosure.

Referring to FIG. 4, a photoresist 57 is applied over the top surfaces of the at least one pad layer 40 and the upper conductive fill material portions 60B, and is lithographically patterned to form openings therein. The pattern in the openings in the photoresist corresponds to shallow trench areas, i.e., areas from which portions of the top semiconductor layer 30 are subsequently removed to form shallow trenches therein. The pattern in the photoresist is transferred into the at least one pad layer 40 and the top semiconductor layer 30 by an anisotropic etch that employs the photoresist 57 as an etch mask.

For each upper conductive fill material portion 60B, a portion that is covered by the photoresist 57 is protected from the anisotropic etch, while a portion not covered by the photoresist 57 is recessed. The etch can be end-pointed to stop at the top surface of the buried insulator layer 20. Each region recessed by the etch constitutes a shallow trench. The shallow trenches include at least one deep-trench-overlying shallow trench 99A and at least one stand-alone shallow trench 99B. Recessed top surfaces of the upper conductive fill material portions 60B can be coplanar with, or located below, the top surface of the buried insulator layer 20. The photoresist 57 is subsequently removed selective to the at least one pad layer 40, for example, by ashing.

The remaining portions of the single crystalline semiconductor layer 30L become single crystalline semiconductor portions 30B, which are laterally spaced from one another by the at least one deep-trench-overlying shallow trench 99A and the at least one stand-alone shallow trench 99B.

Figure 5:
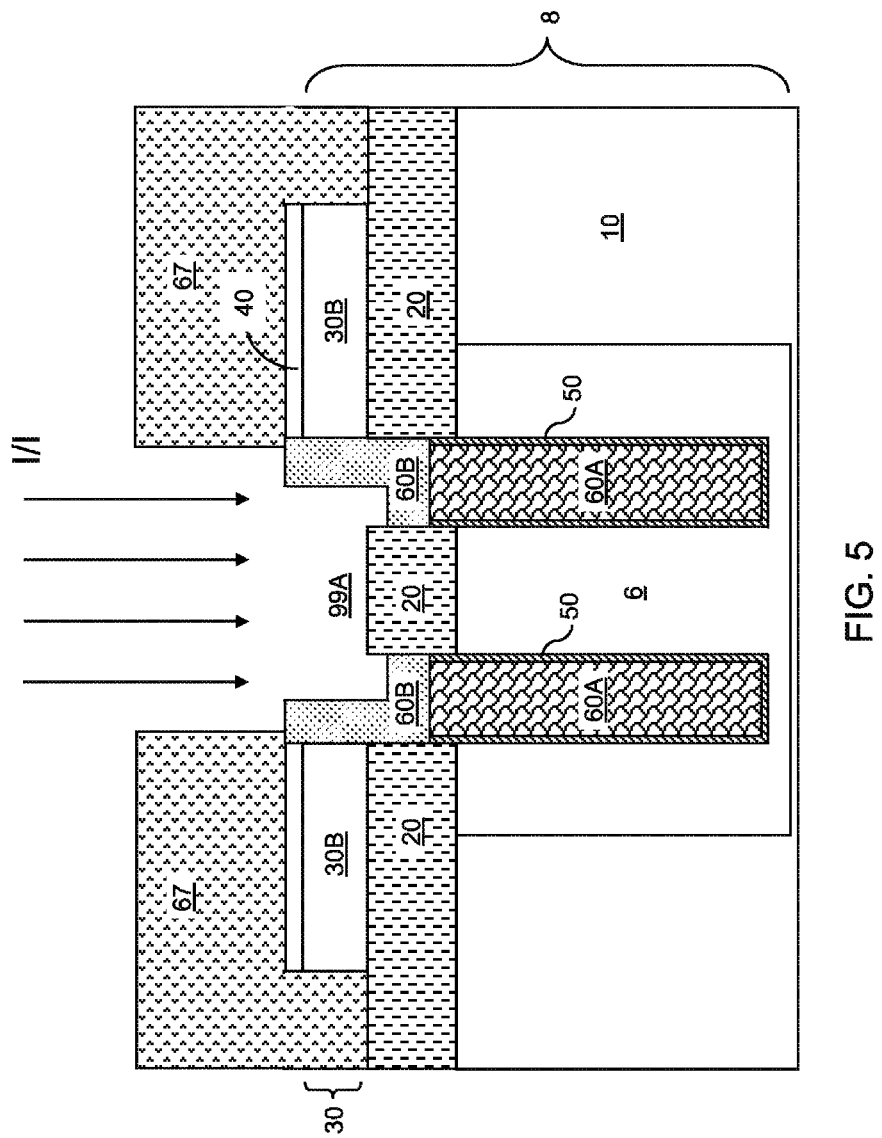
FIG. 5 is a vertical cross-sectional view of the first exemplary semiconductor structure during ion implantation of additional dopants into doped semiconductor fill portions according to the first embodiment of the present disclosure.

Referring to FIG. 5, an implantation-level photoresist 67 can be optionally applied over the semiconductor substrate 8 and the at least one pad layer 40, and lithographically patterned to form openings over an area including the area of the at least one deep-trench-overlying shallow trench 99A. P-type dopants or n-type dopants can be implanted into the upper conductive fill material portions 60B.

In one embodiment, the upper conductive fill material portions 60B can be deposited as doped semiconductor fill portions, and the conductivity type of the dopants implanted into the upper conductive fill material portions 60B can be of the same conductivity type as the dopants introduced into the upper conductive fill material portions 60B at the deposition step. In this embodiment, the additional dopants introduced by the implantations increases the dopant concentration and the conductivity of the upper conductive fill material portions 60B.

In another embodiment, the upper conductive fill material portions 60B can be deposited as undoped semiconductor fill portions, and the upper conductive fill material portions 60B can become doped semiconductor fill portions by the implantation.

The implantation-level photoresist 67 is subsequently removed, for example, by ashing. If the upper conductive fill material portions 60B are deposited as doped semiconductor fill portions, the processing steps of FIG. 5 can be omitted.

Figure 6:
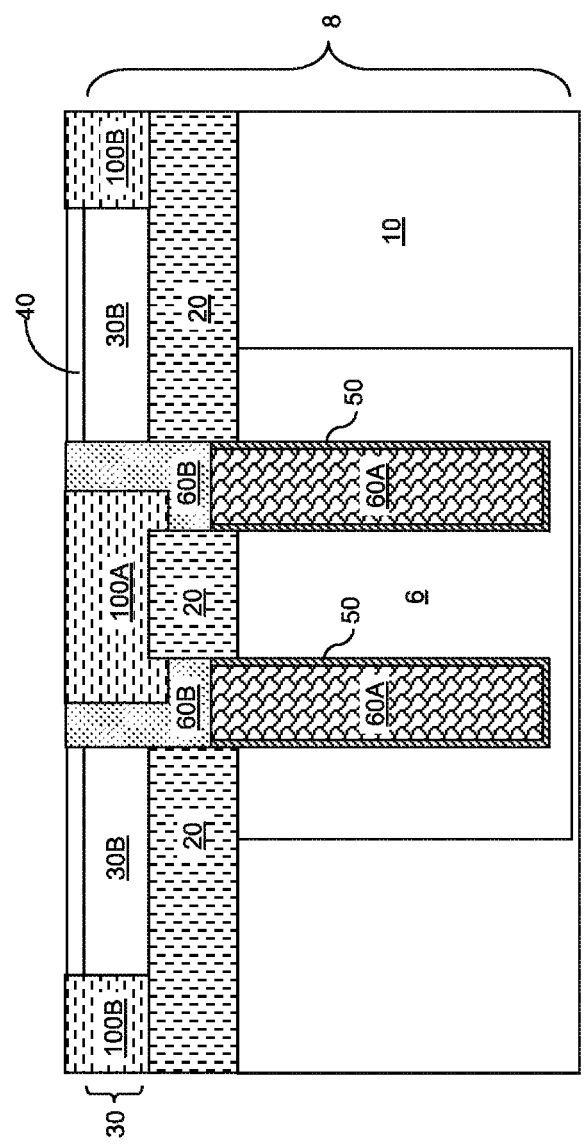
FIG. 6 is a vertical cross-sectional view of the first exemplary semiconductor structure after formation of various shallow trench isolation structures according to the first embodiment of the present disclosure.

Referring to FIG. 6, a dielectric material such as silicon oxide is deposited within each shallow trench (99A, 99B), and is subsequently planarized to form various shallow trench isolation structures (100A, 100B). The various shallow trench isolation structures (100A, 100B) include at least one deep-trench-overlying shallow trench isolation structure 100A and at least one stand-alone shallow trench isolation structure 100B. The top surfaces of the various shallow trench isolation structures (100A, 100B) are substantially coplanar with the top surface of the at least one pad layer 40 after the planarization process. Topmost surfaces of the upper conductive fill material portions 60B are physically exposed after the planarization process.

Each deep-trench-overlying shallow trench isolation structure 100A partly overlies an upper conductive fill material portion 60B, and does not overlie the entirety of the upper conductive fill material portion 60B. At this processing step, each upper conductive fill material portion 60B is a doped semiconductor fill portion.

Figure 7:
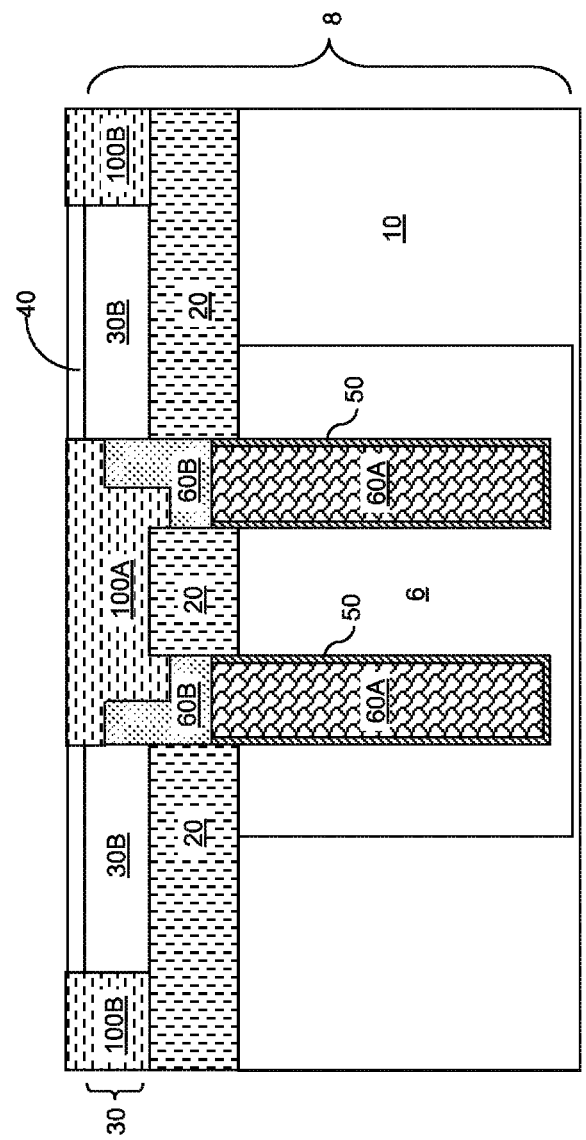
FIG. 7 is a vertical cross-sectional view of the first exemplary semiconductor structure after extending a trench-top shallow trench isolation structure by conversion of exposed portions of the doped semiconductor fill portions according to the first embodiment of the present disclosure.

Referring to FIG. 7, a thermal oxidation or a plasma oxidation is performed to convert physically exposed portions of the upper conductive fill material portion 60B into dielectric material portions. Upon formation, the dielectric material portions including a dielectric semiconductor oxide are incorporated into the at least one deep-trench-overlying shallow trench isolation structure 100A. In other words, the at least one deep-trench-overlying shallow trench isolation structure 100A is extended to incorporate the dielectric material portions that are formed by thermal oxidation or plasma oxidation. For example, if the upper conductive fill material portions 60B include doped amorphous silicon or doped polysilicon, the dielectric material portions formed by conversion can include silicon oxide. If thermal oxidation is employed and if the upper conductive fill material portions 60B include doped amorphous silicon prior to thermal oxidation, the thermal cycling employed for thermal oxidation of the exposed portions of the upper conductive fill material portions 60B causes the remaining portions of the upper conductive fill material portions 60B to become polycrystalline, i.e., to become doped polycrystalline semiconductor portions.

The incorporated dielectric material portions become laterally protruding portions of the at least one deep-trench-overlying shallow trench isolation structure 100A that laterally contact the single crystalline semiconductor portions 30B. The bottommost surface of the laterally protruding portions of the at least one deep-trench-overlying shallow trench isolation structure 100A can be located between a horizontal plane of top surfaces of the single crystalline semiconductor portions 30B and a horizontal plane of the interface between the single crystalline semiconductor portions 30B and the buried insulator layer 20.

Figure 8:
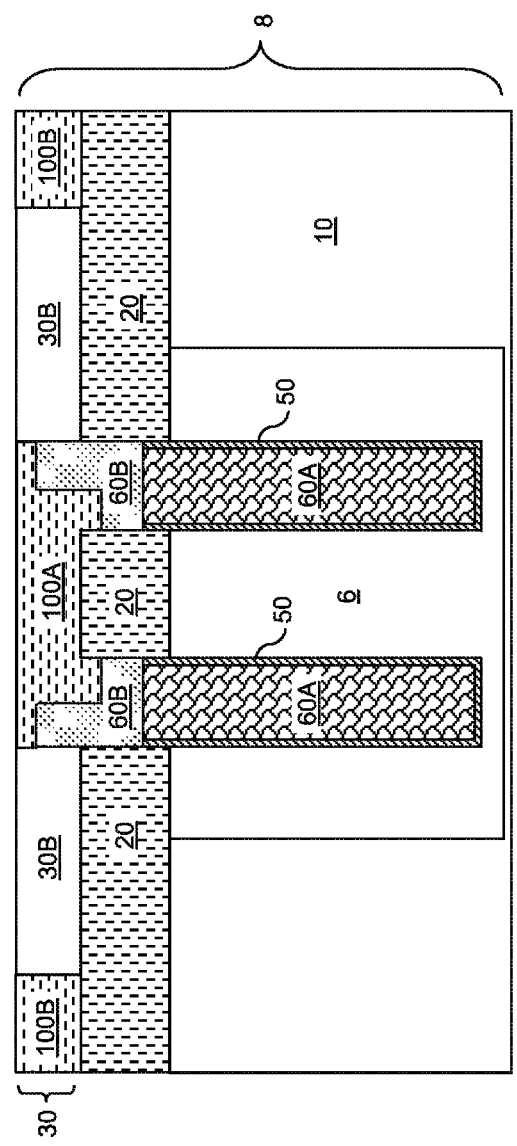
FIG. 8 is a vertical cross-sectional view of the first exemplary semiconductor structure after removal of a pad layer and recessing of the various shallow trench isolation structures according to the first embodiment of the present disclosure.

Referring to FIG. 8, the at least one pad layer 40 is removed, for example, by a wet etch. The various shallow trench isolation structures (100A, 100B) are vertically recessed so that the top surfaces of the various shallow trench isolation structures (100A, 100B) are coplanar with the top surfaces of the single crystalline semiconductor portions 30B.

Figure 9:
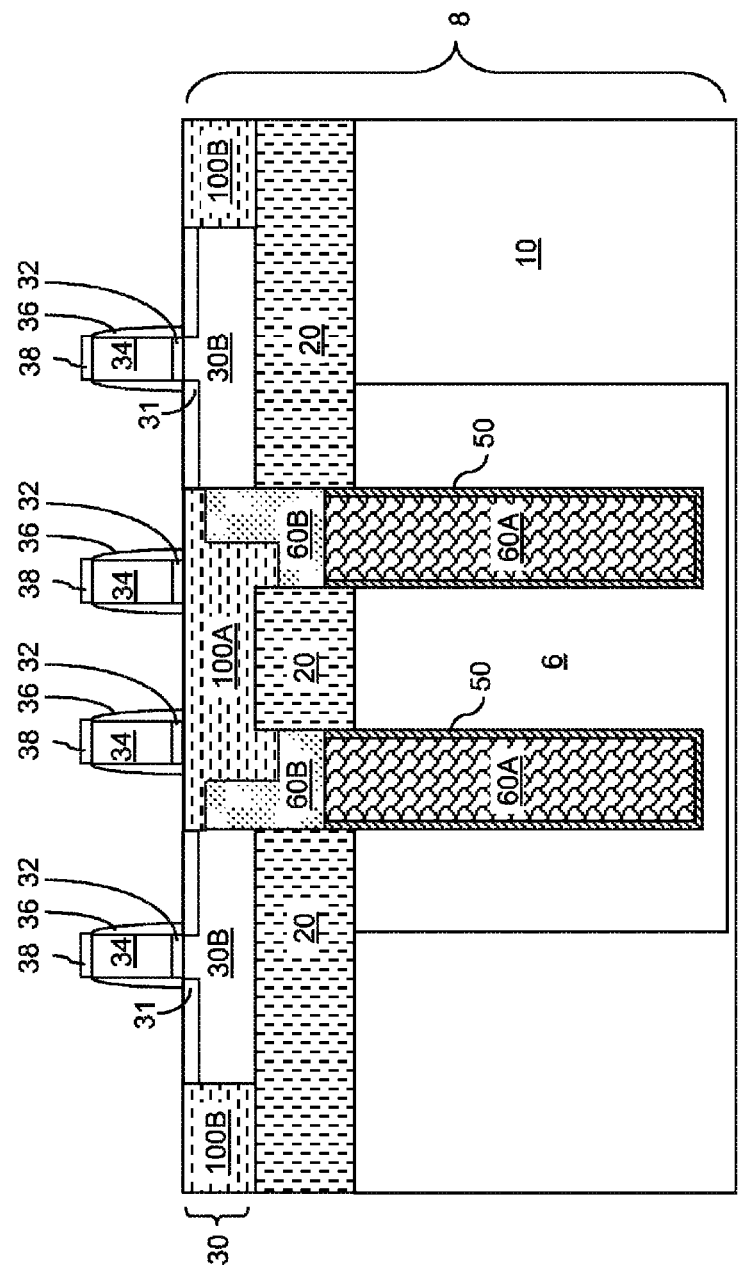
FIG. 9 is a vertical cross-sectional view of the first exemplary semiconductor structure after formation of active gate stacks and passing gate stacks according to the first embodiment of the present disclosure.

Referring to FIG. 9, gate stacks and gate spacers are formed on the top surface of the semiconductor substrate 8. The gate stacks can be formed by sequentially depositing a gate dielectric layer and a gate conductor layer, and optionally, a gate cap dielectric layer. The gate dielectric layer, the gate conductor layer, and the optional gate cap dielectric layer are patterned, for example, by application and patterning of a photoresist layer (not shown), transfer of the pattern in the photoresist layer into the underlying stack of the optional gate cap dielectric layer, the gate conductor layer, and the gate dielectric layer, and removal of the photoresist layer. Each gate stack includes a gate dielectric 32, a gate electrode 34, and optionally a gate cap dielectric 38.

Source and drain extension regions 31 can be formed by implanting dopants into regions of the single crystalline semiconductor portions 30B that are not covered by the gate stacks (32, 34, 38). Each source extension region 31 and each drain extension region 31 can have a sidewall that is vertically coincident with a sidewall of a gate stack (32, 34, 38). Gate spacers 36 are formed on the sidewalls of the gate stacks (32, 34, 38) by deposition of a conformal dielectric material layer and an anisotropic etch that removes horizontal portions of the conformal dielectric material layer. The gate spacers 36 include a dielectric material such as silicon oxide, silicon nitride, and silicon oxynitride. The gate spacers 36 contact top surfaces of the source and drain regions. Each gate spacer 36 laterally surrounds a gate stack (32, 34, 38).

A gate stack (32, 34, 38) directly contacting a single crystalline semiconductor portion 30B is herein referred to as an active gate stack, and a gate stack (32, 34, 38) directly contacting a deep-trench-overlying shallow trench isolation structure 100A is herein referred to as a passing gate stack. An active gate stack may, or may not, be laterally adjoined directly to a passing gate stack. Likewise, a passing gate stack may, or may not, be laterally adjoined directly to an active gate stack.

If any portion of the upper conductive fill material portions 60B is amorphous prior to formation of the gate stacks (32, 34, 38), the entirety of the upper conductive fill material portions 60B is converted into doped polycrystalline semiconductor fill portions because deposition of the gate dielectric layer and the gate cap layer requires elevated temperatures that exceed 600° C., which is sufficient to convert amorphous semiconductor materials into polycrystalline semiconductor materials.

Figure 10:
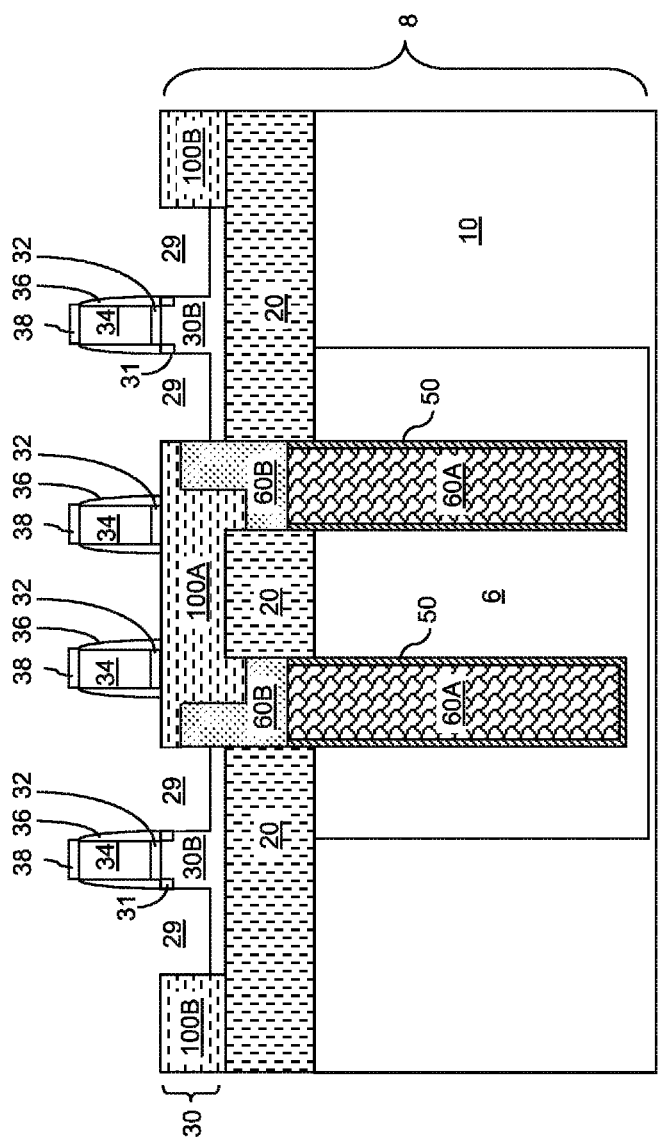
FIG. 10 is a vertical cross-sectional view of the first exemplary semiconductor structure after formation of source/drain trenches according to the first embodiment of the present disclosure.

Referring to FIG. 10, an anisotropic etch is performed employing the combination of the gate stacks (32, 26, 28), the gate spacers 36, and the various shallow trench isolation structures (100A, 100B) as an etch mask. The physically exposed portions of the source and drain extension regions 31 are etched by the anisotropic etch. The anisotropic etch proceeds from a level that is coplanar with the topmost surfaces of the single crystalline semiconductor portions 30B to a depth that is greater than the depth of the bottom surfaces of the source and drain regions 31 and is lesser than the depth of the interface between the single crystalline semiconductor portions 30B and the buried insulator layer 20. Source/drain trenches 29 are formed on both sides of each combination of a gate stack (32, 34, 38) and a gate spacer 36 laterally surrounding the gate stack (32, 34, 38).

As used herein, a "source/drain trench" refers to a trench formed adjacent to a region of a single crystalline semiconductor material that underlies a gate stack (32, 34, 38). A source/drain trench 29 is laterally spaced from a region of a single crystalline semiconductor material that underlies a gate stack (32, 34, 38) by no more than a lateral thickness of a gate spacer 36. The lateral thickness of a gate spacer 36 is a horizontal distance between an inner sidewall and an outer sidewall at a base of the gate spacer 36.

The source/drain trenches 29 are formed within the single crystalline semiconductor portions 30B located within the top semiconductor layer 30. At this processing step, each source/drain trench 29 is laterally bounded by a sidewall surface of an upper conductive fill material portion 60B, which is a doped polycrystalline semiconductor fill portion. Because the gate spacers 36 are employed as a component of the etch mask, a vertical sidewall of each source/drain trench 29 is formed to be vertically coincident with a bottom portion of an outer sidewall of an overlying gate spacer 36. As used herein, a first sidewall and a second sidewall are "vertically coincident" if the first sidewall and the second sidewall overlap in a top-down view, which is a view from above in a vertical direction.

Figure 11:
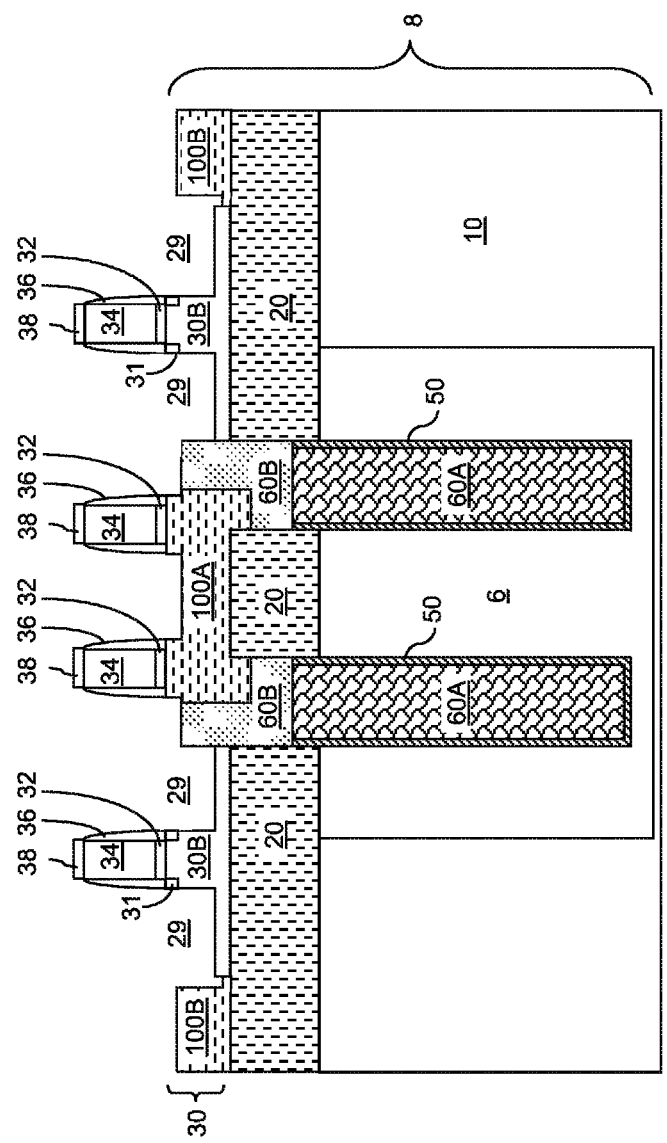
FIG. 11 is a vertical cross-sectional view of the first exemplary semiconductor structure after additional recessing of the various shallow trench isolation structures and exposing top surfaces of the doped polycrystalline semiconductor fill portions according to the first embodiment of the present disclosure.

Referring to FIG. 11, top surfaces of the upper conductive fill material portions 60B are physically exposed by performing an etch that recesses physically exposed portions of the various shallow trench isolation structures (100A, 100B). The etch can be an isotropic etch such as a wet etch, or an anisotropic etch such as a reactive ion etch.

Specifically, the dielectric material portions that are generated by conversion of the upper portions of the upper conductive fill material portions 60B (See FIG. 7) and incorporated into the at least one deep-trench-overlying shallow trench isolation structure 100A is removed. The underlying top surfaces of the upper conductive fill material portions 60B are thus physically exposed. Further, upper portions of the stand-alone shallow trench isolation structures 100B are also removed. The top surfaces of the stand-alone shallow trench isolation structures 100B can be substantially coplanar with the top surfaces of the at least one deep-trench-overlying shallow trench isolation structure 100A and/or the top surfaces of the stand-alone shallow trench isolation structures 100B.

For example, if the various shallow trench isolation structures (100A, 100B) include a silicon-oxide based material, the etch can be a wet etch employing hydrofluoric acid that removes the silicon-oxide based material selective to semiconductor materials of the single crystalline semiconductor portions 30B and the upper conductive fill material portions 60B.

Figure 12:
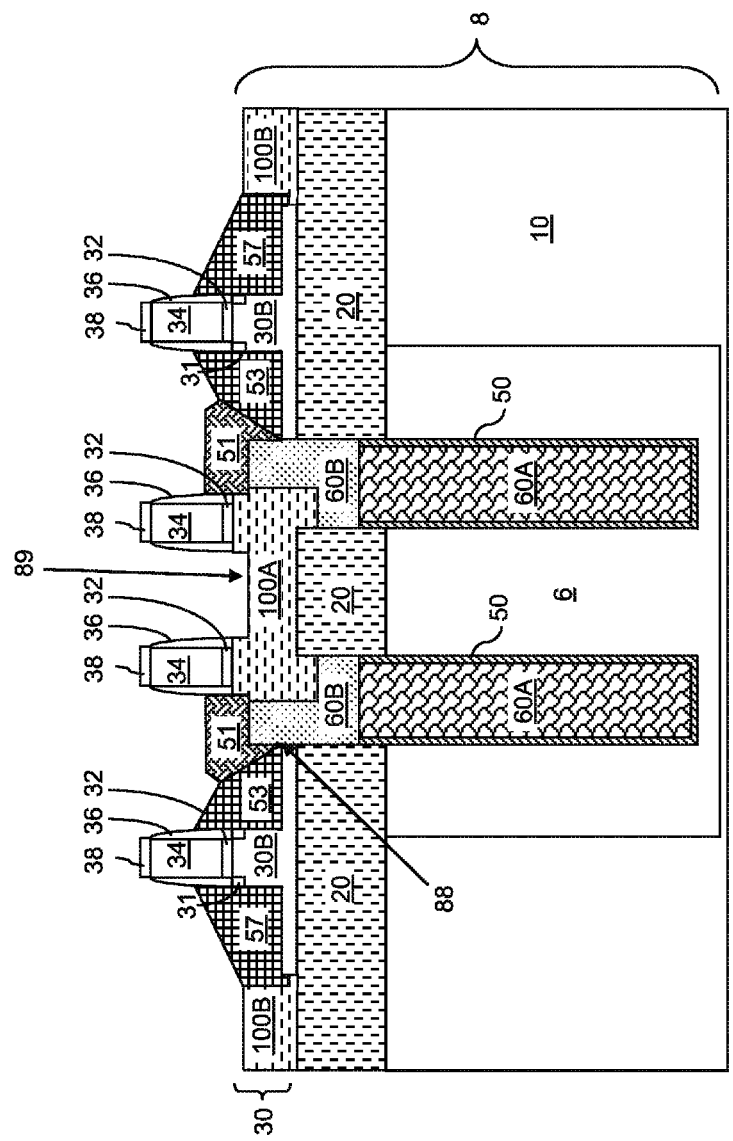
FIG. 12 is a vertical cross-sectional view of the first exemplary semiconductor structure after formation of source regions and polycrystalline semiconductor material portions by selective deposition of a semiconductor material according to the first embodiment of the present disclosure.

Referring to FIG. 12, selective deposition process is performed to fill the source/drain trenches 29 with a semiconductor material. The selective deposition process can include a selective epitaxy process, in which at least one reactant gas and at least one etchant gas are simultaneously or alternately flowed into a process chamber in which the first exemplary semiconductor structure is loaded. Exemplary reactant gases include $SiH_4$, $SiH_2Cl_2$, $SiCl_3$, $SiCl_4$, $Si_2H_6$, $GeH_4$, $Ge_2H_6$, and other precursor reactants for depositing compound semiconductor materials. Exemplary etchant gases include HCl and chlorine-including reactant gases that produce HCl as a byproduct. Temperature for selective deposition process can be from 500° C. to 800° C., and can be optimized for different integration flow. A single crystalline semiconductor material is epitaxially grown on the surfaces of the single crystalline semiconductor portions 30B, of which the single crystalline material acts as growth seed for the epitaxially grown semiconductor material. Concurrently with the selective deposition of the single crystalline semiconductor material on the surfaces of the single crystalline semiconductor portions 30B, a polycrystalline semiconductor material can be grown on the surfaces of the upper conductive fill material portions 60B. In one embodiment, the upper conductive fill material portions 60B can be recrystallined to increase the size of the polycrystalline grains therein during the selective deposition process or in an optional subsequent thermal anneal process.

The selective deposition process utilizes the differential between a nucleation time on semiconductor surfaces and a nucleation time on dielectric surfaces, which is greater than the nucleation time on semiconductor surfaces. The amount of the at least one etchant is controlled so that nucleation on semiconductor surfaces proceeds, while nucleation on dielectric surfaces is suppressed. Thus, the selective deposition process nucleates the semiconductor material only on semiconductor surfaces, while nucleation on dielectric surfaces is suppressed by the at least one etchant gas.

The material deposited by the selective deposition process is in-situ doped with either p-type dopants (such as B, Ga, and In) or n-type dopants (such as P, As, and Sb). The conductivity type of the doped deposited material is the same as the conductivity type of the upper conductive fill material portions 60B.

The single crystalline semiconductor portions 30B can be undoped or doped with p-type dopants or n-type dopants. If the single crystalline semiconductor portions 30B are doped, the conductivity type of the single crystalline semiconductor portions 30B is herein referred to as a first conductivity type. In this case, the conductivity type of the doping of the material deposited by the selective deposition and the conductivity type of the doping of the upper conductive fill material portions 60B are the opposite of the first conductivity type, which is herein referred to as a second conductivity type.

Except for the differences in the dopant types and ignoring differences, if any, in crystalline structures, the material deposited by the selective deposition process can be the same as, or different from, the semiconductor material in the single crystalline semiconductor portions 30B. Further, except for the differences in the dopant types and ignoring differences, if any, in crystalline structures, the material deposited by the selective deposition process can be the same as, or different from, the semiconductor material in upper conductive fill material portions 60B.

The semiconductor material of the single crystalline semiconductor portions 30B is herein referred to as a first semiconductor material, which is a single crystalline semiconductor material. In one embodiment, the single crystalline semiconductor material of the single crystalline semiconductor portions can be single crystalline p-doped silicon. The semiconductor material of the upper conductive fill material portions 60B is herein referred to as a second semiconductor material, which is a doped polycrystalline semiconductor material. In one embodiment, the doped polycrystalline semiconductor material can be n-doped polysilicon or an n-doped polycrystalline silicon-germanium alloy.

The semiconductor material deposited in the selective deposition process is herein referred to as a third semiconductor material. First portions of the third semiconductor material grow from nuclei that nucleate on the surfaces of the single crystalline semiconductor portions 30B within source/drain trenches 29 including a sidewall that is also a sidewall of an upper conductive fill material portion 60B. The first portions of the third semiconductor material are herein referred to as source regions 53. The source regions 53 are embedded within the top semiconductor layer 30. Each source region 53 is epitaxially aligned to an underlying and laterally abutting single crystalline semiconductor portion 30B.

Second portions of the third semiconductor material grow from nuclei that nucleate on the surfaces of the single crystalline semiconductor portions 30B within source/drain trenches 29 that is not laterally bounded by an upper conductive fill material portion 60B. The second portions of the third semiconductor material are herein referred to as drain regions 57. The drain regions 57 are embedded within the top semiconductor layer 30. Each drain region 57 is epitaxially aligned to an underlying and laterally abutting single crystalline semiconductor portion 30B.

The drain regions 57 include the same semiconductor material as the source regions 53. In one embodiment, the source regions 53 and the drain regions 57 include a single crystalline semiconductor material that is different from the single crystalline semiconductor material of the single crystalline semiconductor portions 30B. Further, the single crystalline semiconductor material in the source regions 53 and the drain regions 57 can have a lattice constant that is different from the lattice constant of the single crystalline semiconductor material of the single crystalline semiconductor portions 30B.

In one embodiment, the single crystalline semiconductor portions 30B include undoped or p-doped single crystalline silicon, and the source regions 53 and the drain regions 57 include n-doped single crystalline silicon carbon alloy that is epitaxially aligned to the underlying and laterally abutting single crystalline semiconductor portions 30B. The atomic concentration of carbon in the source regions 53 and the drain regions 57 can be greater than 0% and less than 2.0% so that the entirety of the source regions 53 and the drain regions 57 remain single crystalline. In this embodiment, the lattice constant of the single crystalline semiconductor material in the source regions 53 and the drain regions 57 is less than the lattice constant of the single crystalline semiconductor material of the single crystalline semiconductor portions 30B, and a tensile stress is applied to the channel of each transistors employing one of the source regions 53 as a source and one of the drain regions 57 as a drain. The tensile stress can increase the mobility of the minority charge carriers (electrons) in the transistors to enhance the on-current.

Third portions of the third semiconductor material grow from nuclei that nucleate on the surfaces of the upper conductive fill material portion 60B. The third portions of the third semiconductor material are herein referred to as polycrystalline semiconductor material portions 51. Portions of the polycrystalline semiconductor material portions 51 are embedded within the top semiconductor layer 30, and other portions of the polycrystalline semiconductor material portions 51 is located above the plane of the bottom surface of the gate dielectrics 32. In this configuration, the top semiconductor layer 30 refers to the entirety of the first exemplary semiconductor structure between a first horizontal plane including the top surface of the buried insulator layer 20 and a second horizontal plane including a bottom surface of the gate dielectrics 32.

The polycrystalline semiconductor material portions 51 grow from nuclei that nucleate on the surfaces of the upper conductive fill material portions 60B. Because the polycrystalline semiconductor material portions 51 are polycrystalline, the polycrystalline semiconductor material portions 51 are not epitaxially aligned to any single crystalline semiconductor portion 30B.

The material of the polycrystalline semiconductor material portions 51 differ from the material of the source regions 53 and drain regions 57 by crystallinity. In one embodiment, the polycrystalline semiconductor material portions 51 can have the same atomic composition as the source regions 53 and the drain regions 57.

In one embodiment, the single crystalline semiconductor portions 30B include undoped or p-doped single crystalline silicon, and the source regions 53 and the drain regions include n-doped single crystalline silicon carbon alloy that is epitaxially aligned to the underlying and laterally abutting single crystalline semiconductor portions 30B, and the polycrystalline semiconductor material portions 51 include n-doped polycrystalline silicon carbon alloy. The atomic concentration of carbon in the polycrystalline semiconductor material portions 51 can be greater than 0% and less than 2.0%.

In one embodiment, each of the source regions 53 and the drain regions 57 is an epitaxial semiconductor material portion that includes an n-doped carbon-doped silicon, and the single crystalline semiconductor material in the single crystalline semiconductor portions 30B includes silicon, and does not include carbon. In one embodiment, the doped polycrystalline semiconductor fill portions 51 include n-doped polysilicon or an n-doped polycrystalline silicon-germanium alloy.

In one embodiment, the source regions 53 and/or the drain regions 57 can grow above a horizontal plane including the bottom surfaces of the gate dielectrics 32. In this embodiment, the source regions 53 and the drain regions 57 contact bottom portions of outer sidewalls of the gate spacers 36.

The source regions 53, the drain regions 57, and the polycrystalline semiconductor material portions 51 are deposited simultaneously by the selective semiconductor deposition process that does not nucleate a semiconductor material on dielectric surfaces. Each of the source regions 53 and the drain regions 57 includes a horizontal bottom surface that is in contact with a single crystalline semiconductor portion 30B. Each of a single crystalline semiconductor portion 30B, a source region 53, a polycrystalline semiconductor material portion 51, and an upper conductive fill material portion 60B, which is a doped polycrystalline semiconductor fill portion, can be adjoined to one another at a horizontal line 88 located on a sidewall of the deep trench and is perpendicular to the plane of FIG. 12.

A deep-trench-overlying shallow trench isolation structure 100A can overlie a horizontal surface of the upper conductive fill material portion 60B and laterally contacts a sidewall of the upper conductive fill material portion 60B. A horizontal surface 89 of the deep-trench-overlying shallow trench isolation structure 100A that is in contact with a polycrystalline semiconductor material portion 51 is vertically recessed relative to another horizontal surface (i.e., an interface between the deep-trench-overlying shallow trench isolation structure 100A and a gate dielectric 32) of the deep-trench-overlying shallow trench isolation structure 100A that is in contact with the passing gate stack (32, 34, 38).

Figure 13:
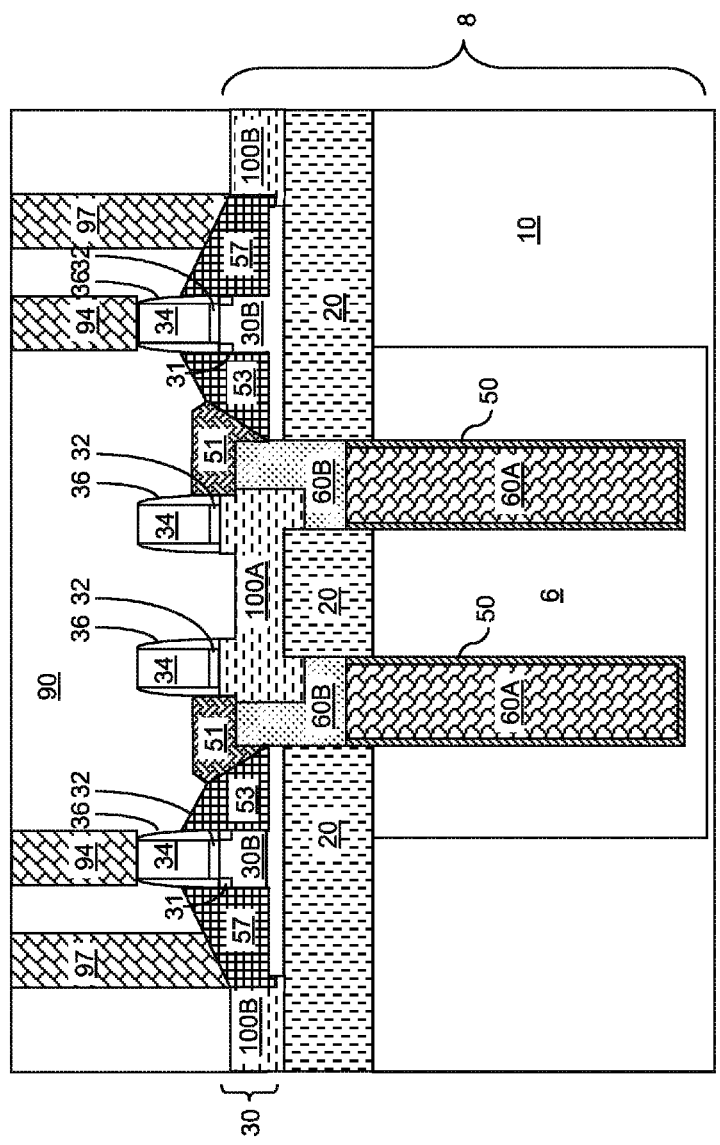
FIG. 13 is a vertical cross-sectional view of the first exemplary semiconductor structure after formation of contact-level dielectric layer and various contact via structures according to the first embodiment of the present disclosure.

Referring to FIG. 13, various metal semiconductor alloy portions (not shown) can be formed on selected semiconductor surfaces. Areas of semiconductor surface in which formation of a metal semiconductor alloy are not desired can be masked, for example, by a temporary masking layer comprising a dielectric material. The various metal semiconductor alloy portions can be formed by depositing a metal layer (not shown) and inducing a reaction between the metal layer and underlying semiconductor material portions.

A contact-level dielectric layer 90 and various contact via structures (94, 97) can be formed over the semiconductor substrate 8. The contact-level dielectric layer 90 can include, for example, a silicon-oxide-based material, silicon nitride, and/or organosilicate glass. The silicon-oxide-based material can be an undoped silicate glass (USG), borosilicate glass (BSG), phosphosilicate glass (PSG), fluorosilicate glass (FSG), borophosphosilicate glass (BPSG), or a combination thereof. The thickness of the contact-level dielectric layer 90 can be from 200 nm to 500 nm. The contact-level dielectric layer 90 is preferably planarized, for example, by chemical mechanical polishing (CMP).

Various contact via holes are formed in the MOL dielectric layer 90 and filled with a conductive material to from various contact via structures. For example, drain contact via structures 97 can be formed to contact the drain regions 57. Gate contact via structures 94 can be formed to contact the gate electrodes 34. The gate cap dielectrics 38 can be removed by etching through during the formation of via cavities that are subsequently filled to form the gate contact structures 94.

Figure 14:
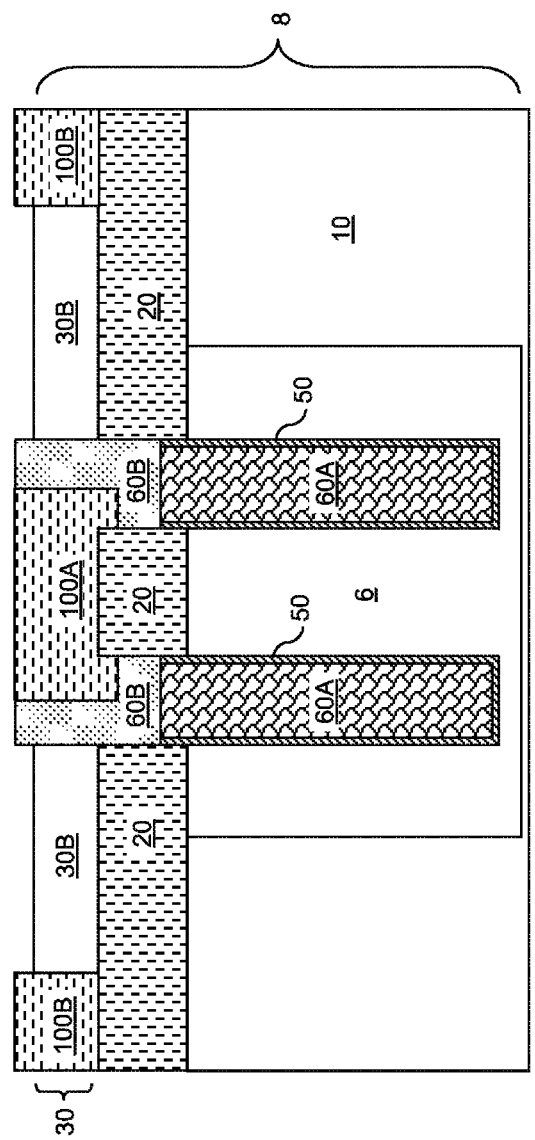
FIG. 14 is a vertical cross-sectional view of a second exemplary semiconductor structure after removal of a pad layer according to a second embodiment of the present disclosure.

Referring to FIG. 14, a second exemplary semiconductor structure according to a second embodiment of the present disclosure is derived from the first exemplary semiconductor structure of FIG. 6 by removing the at least one pad layer 40 selective to the various shallow trench isolation structures (100A, 100B) and the upper conductive fill material portion 60B. In one embodiment, the at least one pad layer 40 can include silicon nitride, and the various shallow trench isolation structures (100A, 100B) can include silicon oxide, and the removal of the at least one pad layer 40 can be effected, for example, by a wet etch employing hot phosphoric acid that removes silicon nitride, and does not remove silicon oxide or silicon.

Figure 15:
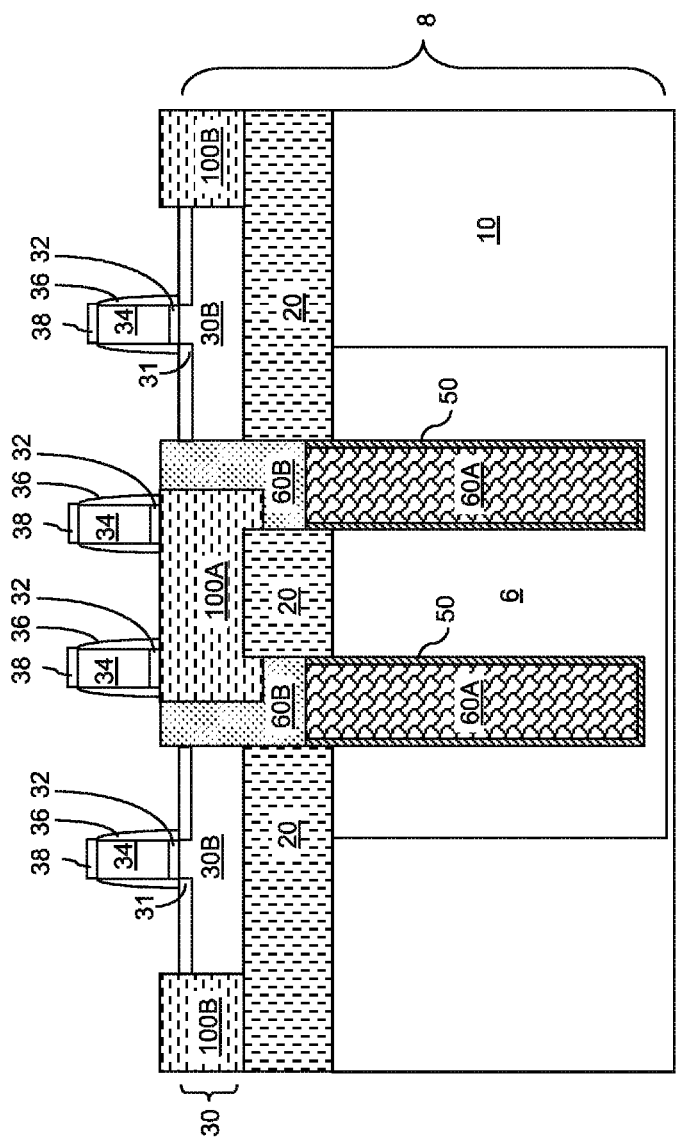
FIG. 15 is a vertical cross-sectional view of the second exemplary semiconductor structure after formation of active gate stacks and passing gate stacks according to the second embodiment of the present disclosure.

Referring to FIG. 15, various gate stacks (32, 34, 38), source and drain extension regions 31, and gate spacers 36 are formed employing the same methods as in the first embodiment. Unlike the first exemplary semiconductor structure illustrated in FIG. 9, bottom surfaces of passing gate stacks (32, 24, 28) contacting the top surface(s) of the at least one deep-trench-overlying shallow trench isolation structure 100A may not be substantially coplanar with bottom surfaces of active gate stacks (32, 34, 38) contacting single crystalline semiconductor portions 30B.

Figure 16:
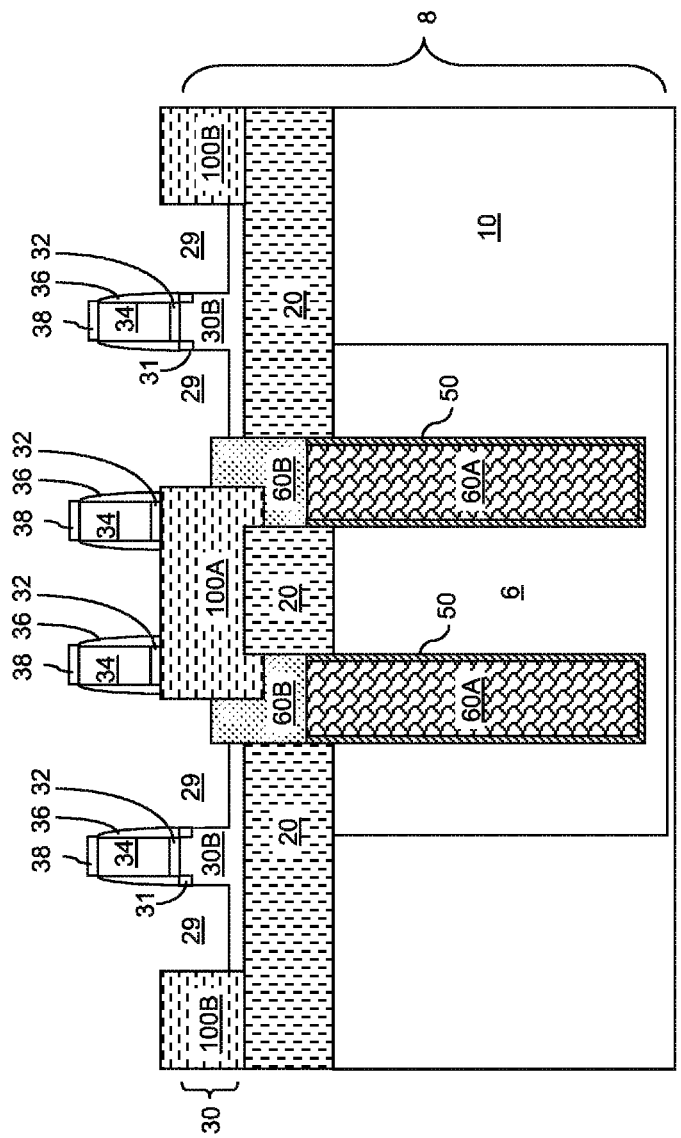
FIG. 16 is a vertical cross-sectional view of the second exemplary semiconductor structure after formation of source/drain trenches according to the second embodiment of the present disclosure.

Referring to FIG. 16, source/drain trenches 29 are formed in the top semiconductor layer 30 employing the same processing steps as in the first embodiment. In contrast with the first embodiment, top surfaces of the upper conductive fill material portions 60B are not protected by an etch mask during the anisotropic etch that forms the source/drain trenches 29. Therefore, the top surfaces of the upper conductive fill material portions 60B are recessed during the anisotropic etch in the second embodiment.

Figure 17:
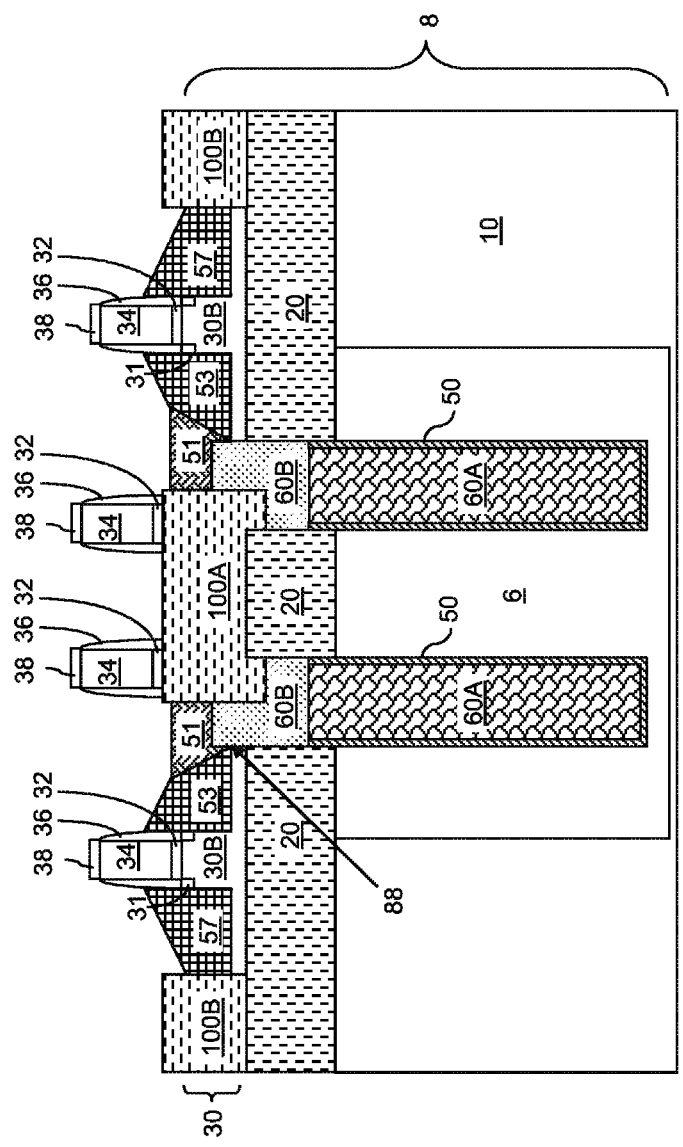
FIG. 17 is a vertical cross-sectional view of the second exemplary semiconductor structure after formation of source regions and polycrystalline semiconductor material portions by selective deposition of a semiconductor material according to the second embodiment of the present disclosure.

Referring to FIG. 17, the same processing steps are employed to form source regions 53, drain regions 57, and polycrystalline semiconductor material portions 51 as in the first embodiment. The entirety of the top surfaces of the various shallow trench isolation structures (100A, 100B) is coplanar in the second exemplary semiconductor structure.

Figure 18:
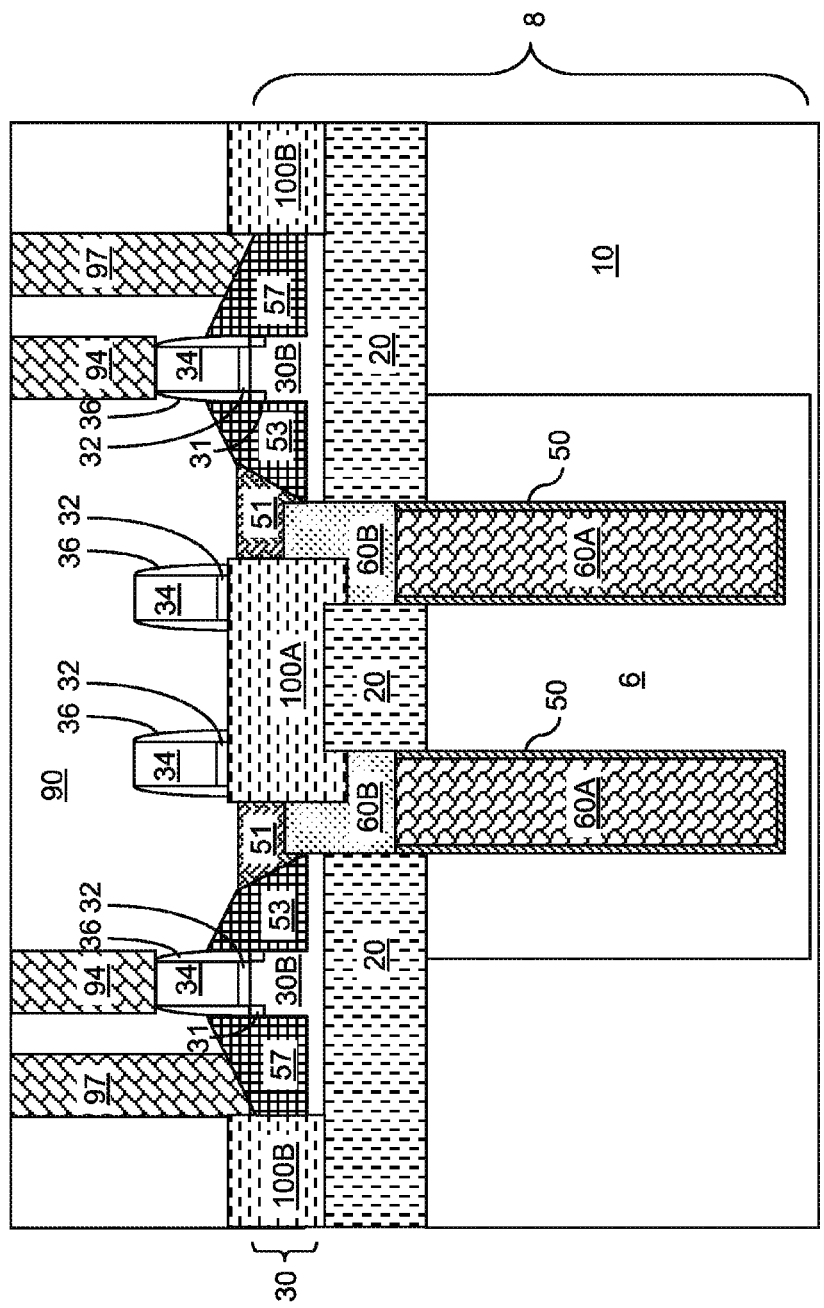
FIG. 18 is a vertical cross-sectional view of the second exemplary semiconductor structure after formation of contact-level dielectric layer and various contact via structures according to the second embodiment of the present disclosure.

Referring to FIG. 18, a contact-level dielectric layer 90 and various contact via structures (94, 97) are formed in the same manner as in the first embodiment.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
a trench located in a semiconductor substrate, extending in a semiconductor layer that comprises a single crystalline semiconductor material, and filled with a node dielectric layer and at least one conductive fill material portion, wherein said at least one conductive material portion includes a doped semiconductor fill portion laterally contacting said single crystalline semiconductor material; and
a source region embedded within said semiconductor layer and comprising another single crystalline semiconductor material that is different from said single crystalline semiconductor material and is epitaxially aligned to said single crystalline semiconductor material; and
a polycrystalline semiconductor material portion contacting a topmost horizontal surface of said doped semiconductor fill portion and comprising a same material as said source region and contacting said source region.

2. The semiconductor structure of claim 1, wherein said epitaxial semiconductor material portion and said single crystalline semiconductor material have different lattice constants.

3. The semiconductor structure of claim 1, wherein said epitaxial semiconductor material portion comprises an n-doped carbon-doped silicon and said single crystalline semiconductor material comprises silicon and does not include carbon.

4. The semiconductor structure of claim 1, wherein said doped semiconductor fill portion comprises n-doped polysilicon or an n-doped polycrystalline silicon-germanium alloy.

5. The semiconductor structure of claim 1, further comprising:
a gate stack including a gate dielectric and a gate electrode; and
a gate spacer laterally surrounding said gate stack, wherein said source region has a vertical sidewall that is vertically coincident with a bottom portion of a sidewall of said gate spacer.

6. The semiconductor structure of claim 5, wherein said source region includes a horizontal bottom surface that is in contact with a portion of said single crystalline semiconductor material.

7. The semiconductor structure of claim 5, wherein said source region contacts said bottom portion of said sidewall of said gate spacer.

8. The semiconductor structure of claim 1, wherein each of a portion of said single crystalline semiconductor material, said source region, said polycrystalline semiconductor material portion, and said doped semiconductor fill portion is adjoined to one another at a horizontal line located on a sidewall of said trench.

9. The semiconductor structure of claim 1, further comprising a shallow trench isolation structure that overlies a horizontal surface of said doped semiconductor fill portion and laterally contacts a sidewall of said doped semiconductor fill portion.

10. The semiconductor structure of claim 9, further comprising a passing gate stack comprising at least a gate electrode and contacting a top surface of said shallow trench isolation structure.

11. The semiconductor structure of claim 10, wherein a horizontal surface of said shallow trench isolation structure in contact with said polycrystalline semiconductor material portion is vertically recessed relative to another horizontal surface of said shallow trench isolation structure that is in contact with said passing gate stack.

* * * * *